(12) United States Patent
Chuang et al.

(10) Patent No.: US 9,356,066 B2
(45) Date of Patent: May 31, 2016

(54) INTERCONNECT STRUCTURE FOR STACKED DEVICE AND METHOD

(71) Applicant: Taiwan Semiconductor Manufacturing Company, Ltd., Hsin-Chu (TW)

(72) Inventors: Chun-Chieh Chuang, Tainan (TW);
Dun-Nian Yaung, Taipei (TW);
Jen-Cheng Liu, Hsin-Chu (TW);
Feng-Chi Hung, Chu-Bei (TW);
Tzu-Hsuan Hsu, Kaohsiung (TW);
Shu-Ting Tsai, Kaohsiun (TW);
Min-Feng Kao, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 16 days.

(21) Appl. No.: 13/898,641

(22) Filed: May 21, 2013

(65) Prior Publication Data

US 2014/0264682 A1    Sep. 18, 2014

Related U.S. Application Data

(60) Provisional application No. 61/794,847, filed on Mar. 15, 2013.

(51) Int. Cl.
*H01L 23/538* (2006.01)
*H01L 27/146* (2006.01)
*H01L 21/768* (2006.01)
*H01L 23/48* (2006.01)

(52) U.S. Cl.
CPC ........ *H01L 27/14636* (2013.01); *H01L 21/768* (2013.01); *H01L 21/76898* (2013.01); *H01L 23/481* (2013.01); *H01L 27/1469* (2013.01); *H01L 2924/0002* (2013.01)

(58) Field of Classification Search
CPC ....... H01L 27/00; H01L 27/146; H01L 23/00; H01L 23/538; H01L 27/14636; H01L 21/768; H01L 31/18; H01L 31/103; H01L 31/02; H01L 23/48; H01L 27/144
USPC ......... 257/431, 777, 625, 734, 748, 758, 774, 257/781, 784
See application file for complete search history.

(56) References Cited

U.S. PATENT DOCUMENTS

| | | | |
|---|---|---|---|
| 2002/0074670 A1* | 6/2002 | Suga | 257/777 |
| 2006/0292744 A1* | 12/2006 | Enquist et al. | 438/107 |
| 2012/0161275 A1* | 6/2012 | Gambino et al. | 257/506 |
| 2012/0256311 A1* | 10/2012 | Takeda et al. | 257/737 |
| 2012/0256319 A1* | 10/2012 | Mitsuhashi | 257/774 |

(Continued)

*Primary Examiner* — Chuong A Luu
(74) *Attorney, Agent, or Firm* — Haynes and Boone, LLP

(57) ABSTRACT

A stacked integrated circuit (IC) device and a method are disclosed. The stacked IC device includes a first semiconductor element and a second semiconductor element bonded on the first semiconductor element. The first semiconductor element includes a first substrate, a common conductive feature in the first substrate, a first inter-level dielectric (ILD) layer, a first interconnection feature and a conductive plug connecting the first interconnection feature to the common conductive feature. The second semiconductor element includes a second substrate, a second ILD layers over the second substrate and a second interconnection feature in second ILD layers. The device also includes a conductive deep plug connecting to the common conductive feature in the first semiconductor element and the second interconnection feature. The conductive deep plug is separated with the conductive plug by the first ILD layer.

20 Claims, 9 Drawing Sheets

(56) References Cited

U.S. PATENT DOCUMENTS

2013/0134576 A1* 5/2013 Hayashi ................. 257/734
2013/0175673 A1* 7/2013 Jin et al. ................. 257/621
2013/0264688 A1* 10/2013 Qian et al. ............... 257/622
2014/0264947 A1* 9/2014 Lin et al. ................. 257/777

* cited by examiner

INTERCONNECT STRUCTURE FOR STACKED DEVICE AND METHOD

This patent claims the benefit of U.S. Ser. No. 61/794,847 filed Mar. 15, 2013, which is hereby incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor technologies further advance, a stacked IC device has emerged as an effective alternative to further reduce the physical size of a semiconductor device. In a stacked IC device, active circuits such as logic, memory, processor circuits and the like are fabricated on different semiconductor wafers. Two or more semiconductor wafers may be installed on top of one another to further reduce the form factor of the IC device. For example, two semiconductor wafers may be bonded together through suitable bonding techniques. One advantageous feature of a stacked IC device is that a higher density can be achieved. Although existing stacked semiconductor devices and methods of fabricating stacked IC devices have been generally adequate for their intended purposes, they have not been entirely satisfactory in all respects. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
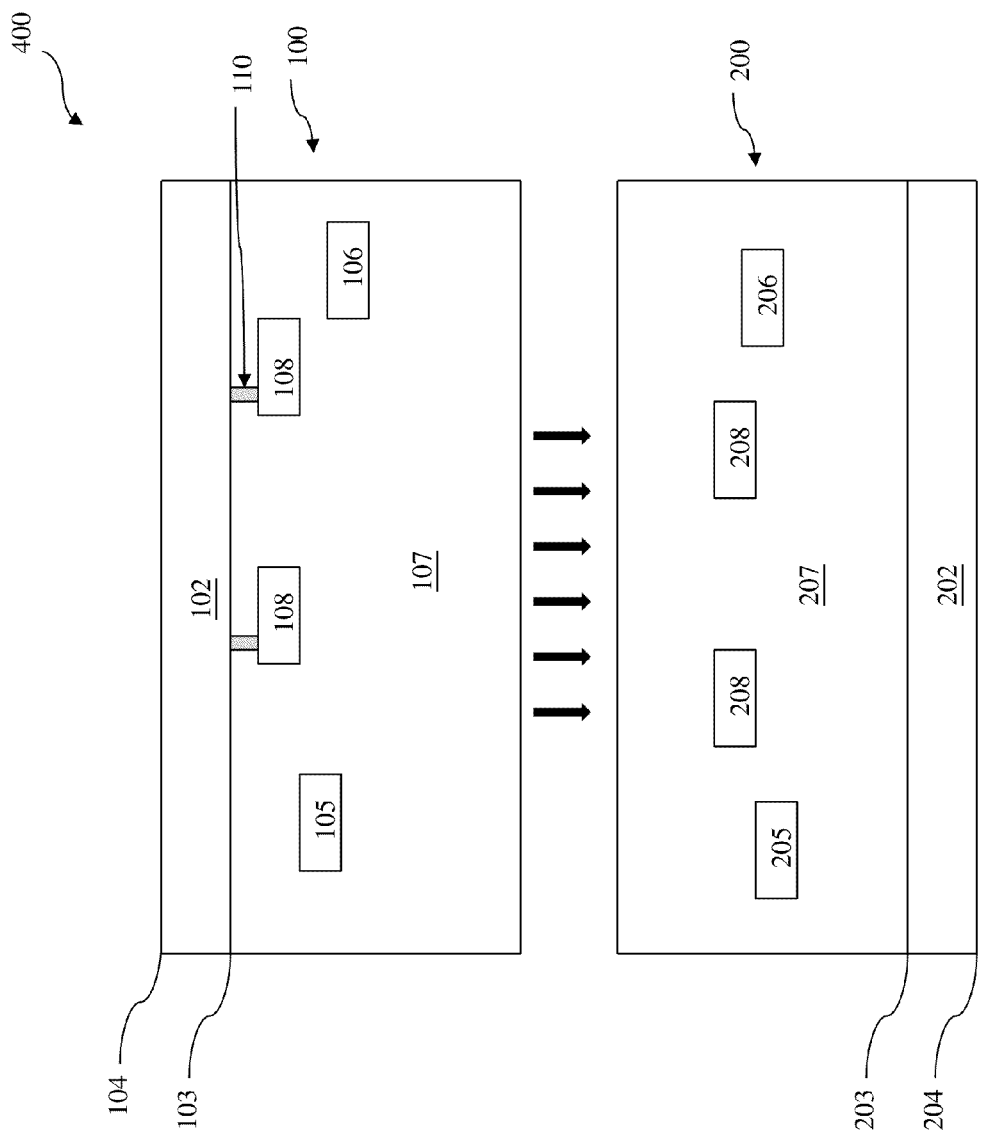
FIG. 1 is a cross-sectional view of a stacked integrated circuit (IC) device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a cross-sectional view of a stacked IC device 400 prior to a bonding process, according to various aspects of the present disclosure. FIG. 1 has been simplified for the sake of clarity to better illustrate the inventive concepts of the present disclosure. The stacked IC device 400 includes a first semiconductor wafer 100 stacked on top of a second semiconductor wafer 200. For example, the first semiconductor wafer 100 includes an image sensor, such as a backside illuminated (BSI) image sensor, a complementary metal-oxide-semiconductor (CMOS) image sensor (CIS), a charge-coupled device (CCD), an active-pixel sensor (APS), or a passive-pixel sensor. An image sensor may be fabricated by complementary metal-oxide semiconductor (CMOS) process techniques known in the art. For example, a p-type photo active region and an n-type photo active region are formed over a substrate of the image sensor wafer to form a PN junction, which functions as a photodiode. The image sensor wafer 100 may include a transistor to generate a signal related to the intensity or brightness of light that impinges on the photo active region. The second semiconductor wafer 200 is an application-specific integrated circuit (ASIC) wafer.

As shown in FIG. 1, the first semiconductor wafer 100 (shown in an upside down position) includes a substrate 102 having a first surface 103 and a second surface 104. In some embodiments, the substrate 102 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride ($CaF_2$), and/or other suitable materials. In some embodiments, the substrate 102 has one or more layers defined within it, such as an epitaxial layer. For example, in one such embodiment, the substrate 102 includes an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions. In the depicted embodiment, the substrate 102 is doped with a p-type dopant. Suitable p-type dopants include boron, gallium, indium, other suitable p-type dopants, and/or combinations thereof. The substrate 102 may also include one or more regions doped with an n-type dopant such as phosphorus, arsenic, other suitable n-type dopants, and/or combinations thereof. Doping may be implemented using a process such as ion implantation or diffusion in various steps and techniques.

In various embodiments, the substrate 102 may take a form of a planar substrate, a fin, a nanowire, and/or other forms known to one of skill in the art.

The first semiconductor wafer 100 may include various passive and active microelectronic components. These components may include a primary component 105, such as an image sensor element and a peripheral circuit element 106, such as one or more field effect transistor. Other examples include P-channel field effect transistors (PFETs), N-channel FETs (NFETs), metal-oxide semiconductor field effect transistors (MOSFETs), CMOS transistors, FinFETs, high voltage transistors, high frequency transistors, bipolar junction transistors, resistors, capacitors, diodes, fuses, other suitable devices, and/or combinations thereof. In some embodiments, the peripheral circuit element 106 is operable to interface with or control the image sensor element 105. Although, in further embodiments, the peripheral circuit element 106 has no functional relationship to the primary element 105 aside from being collocated on the same substrate 102.

The first semiconductor wafer 100 includes a first inter-level dielectric (ILD) layer 107 formed over the first surface 103 of the substrate 102 for isolation purpose. The first ILD layer 107 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. Common methods for forming ILD layer include thermal oxidation, chemical vapor deposition (CVD), high-density plasma CVD (HDP-CVD), physical vapor deposition (PVD), atomic layer deposition (ALD), spin-on deposition, and/or other suitable deposition processes. The first ILD layer 107 may include multiple layers made by different dielectric materials.

The first semiconductor wafer 100 includes first interconnection features 108 formed on the substrate 102 and configured to properly connect various doped regions in the substrate 102, resulting in a functional designed circuit. For example, the first interconnection features 108 include multilayer interconnect (MLI) having horizontal metal lines formed on multiple metal layers and contact/via features to vertically connect metal lines of different metal layers or metal line lines to the substrate 102. The first interconnect features 108 are formed by an integrated process including deposition, lithography and etch.

In the present embodiment, a conductive plug 110 is formed over the substrate 102 such that one end of it connecting to the first interconnection feature 108 and another end of it connecting to the substrate 102. The conductive plug 110 can be made by conductive materials such as materials such as copper, aluminum, aluminum/silicon/copper alloy, titanium, titanium nitride, tungsten, polysilicon, metal silicide, and/or combinations thereof. The conductive plug 110 can be formed by a procedure including lithography, etch and deposition. As an example, prior to forming the first interconnection feature 108, a trench is formed in the first ILD layer 107 by lithography and etch processed. Then the trench is filled by a conductive material to form the conductive plug 110. And then the first interconnection feature 108 is formed on top of the conductive plug 110.

Additional features can be incorporated into the first semiconductor wafer 100 and some of the features described above can be replaced or eliminated for other embodiments of the first semiconductor wafer 100.

The second semiconductor wafer 200 can include similar or different elements, as compared to the first semiconductor wafer 100. For example, the second semiconductor wafer 200 includes a substrate 202 with surfaces 203 and 204, a primary element 205, a peripheral element 206, ILD layers 207, and interconnection features 208.

Figure 2:
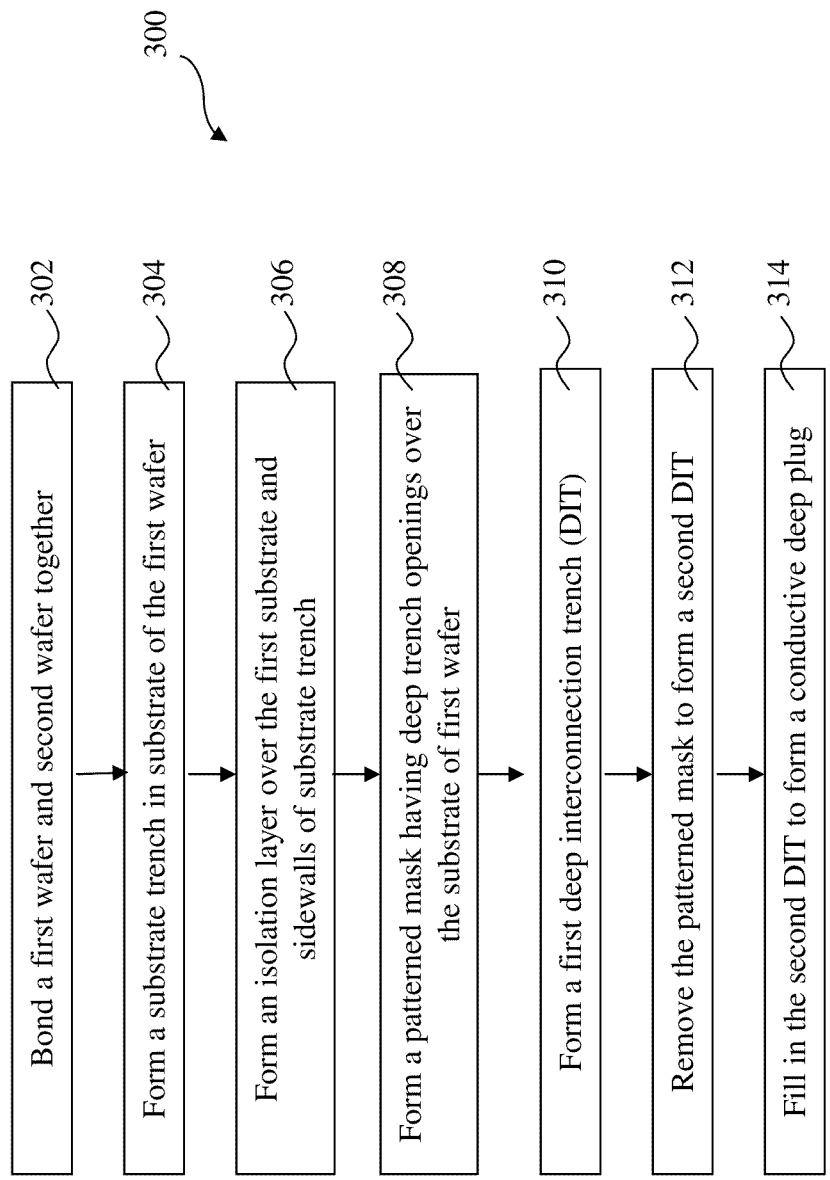
FIG. 2 is a flow chart of an example method for fabricating a stacked IC device according to various aspects of the present disclosure.

FIG. 2 is a flowchart of a method 300 for forming a stacked IC device according to aspects of the present disclosure. FIGS. 3-9 are cross-sectional views of an example stacked IC device 400 undergoing processes according to the method of FIG. 2. It is understood that additional steps can be provided before, during, and after the method, and some of the steps described can be replaced or eliminated for other embodiments of the method.

Figure 3:
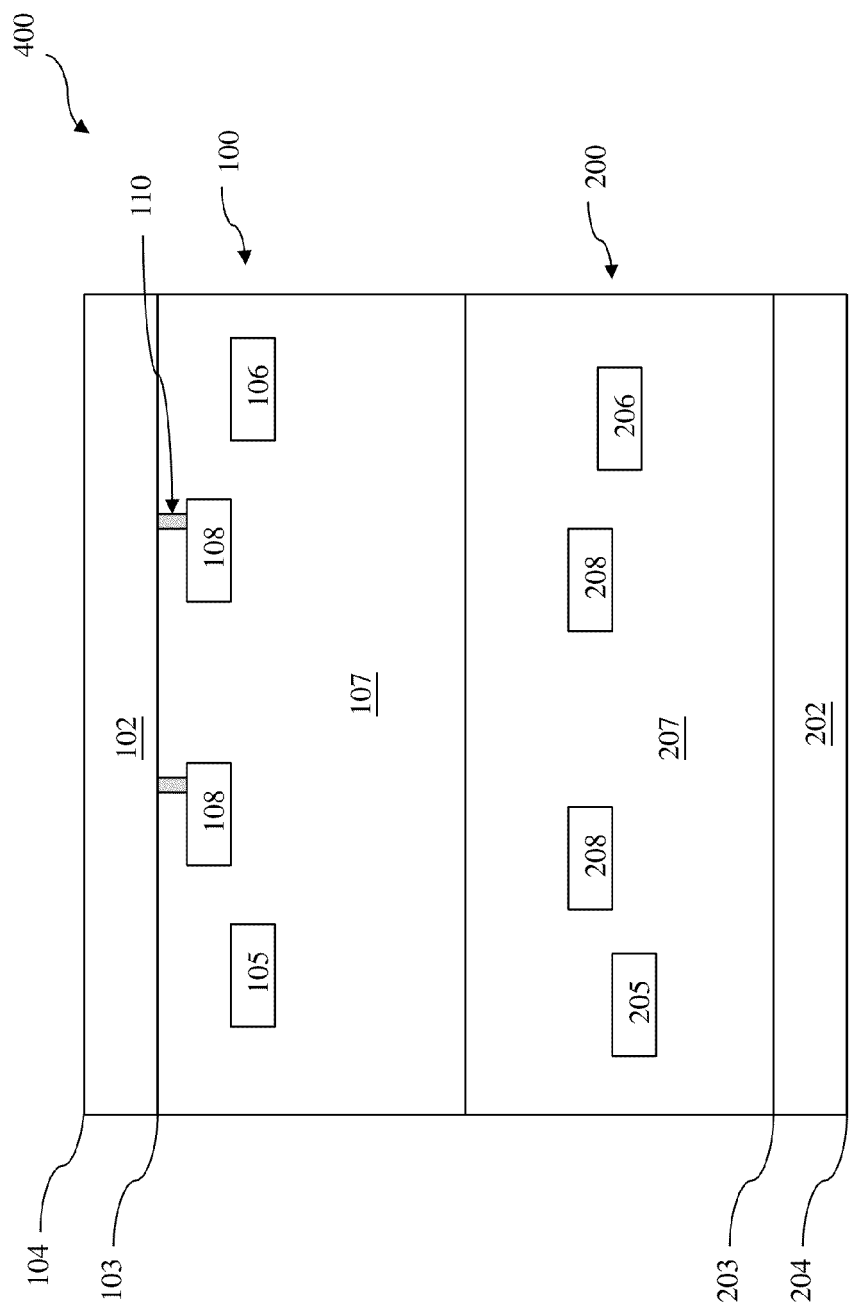
FIGS. 3-9 are cross-sectional views of an example stacked IC device at fabrication stages constructed according to the method of FIG. 2.

Referring to FIGS. 2 and 3, the method 300 begins at step 302 by bonding the first and second semiconductor wafers, 100 and 200, together through suitable bonding techniques such as direct bonding. In some embodiments, a plurality of bonding pads are formed in the first semiconductor wafer 100 and the second semiconductor wafer 200 respectively. Furthermore, the bonding pads located at the second semiconductor wafer 200 are aligned face-to-face with their corresponding bonding pads located at the first semiconductor wafer 100. In accordance with some embodiments, in a direct bonding process, the connection between the first and second semiconductor wafers 100 and 200 can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), or any combination thereof. In some embodiment, the first and second semiconductor wafers, 100 and 200, are connected to each other through suitable three-dimensional structures. An adhesion layer may also be used.

Figure 4:
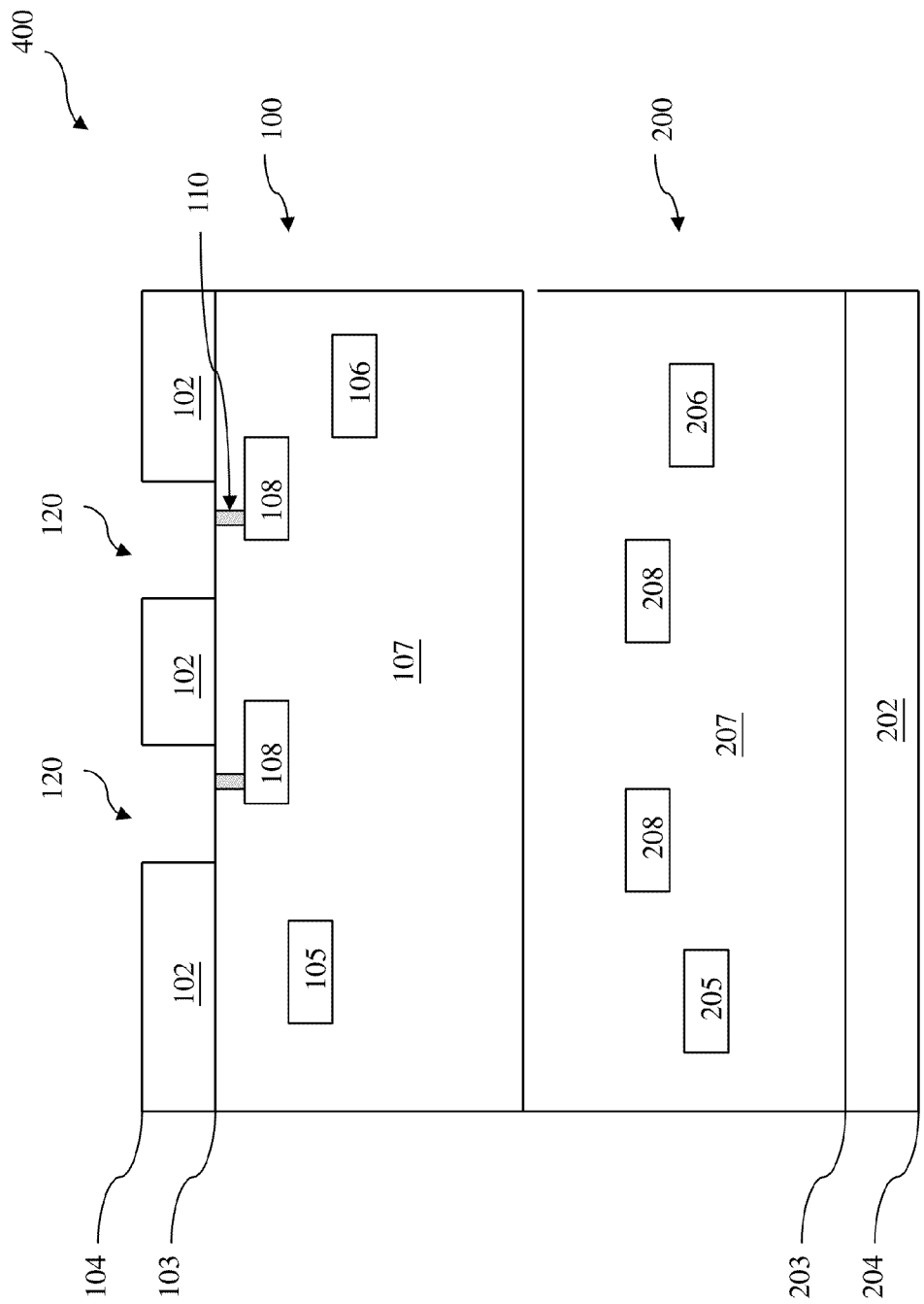

Referring to FIGS. 2 and 4, the method 300 proceeds to step 304 by forming a substrate trench 120 in the substrate 102. The substrate trench 120 is formed such that the first ILD layer 107 and at least a portion of the conductive plug 110 are exposed. The substrate trench 120 may be formed by lithography and etch processes. As an example, a patterned photoresist layer is formed over the substrate 102 by processes of spin-on coating, exposure and developing. Then substrate 102 is etched through the patterned photoresist. The etching process may include a dry etching process, a wet etching process, and/or combination thereof. The etching process may also include a selective wet etch or a selective dry etch. Example wet etching solutions include a tetramethylammonium hydroxide (TMAH), a HF/HNO3/CH3COOH solution, or other suitable solution. An example dry etching processes may include a biased plasma etching process that uses a chlorine-based chemistry. Other example dry etchant gasses include CF4, NF3, SF6, and He. In some embodiments, a selective etch is performed with adequate etch selectivity with respect to the first ILD layer 107 and the conductive plug 110. In that case the first ILD layer 107 serves as an etch-stop layer to improve etching process window.

Figure 5:
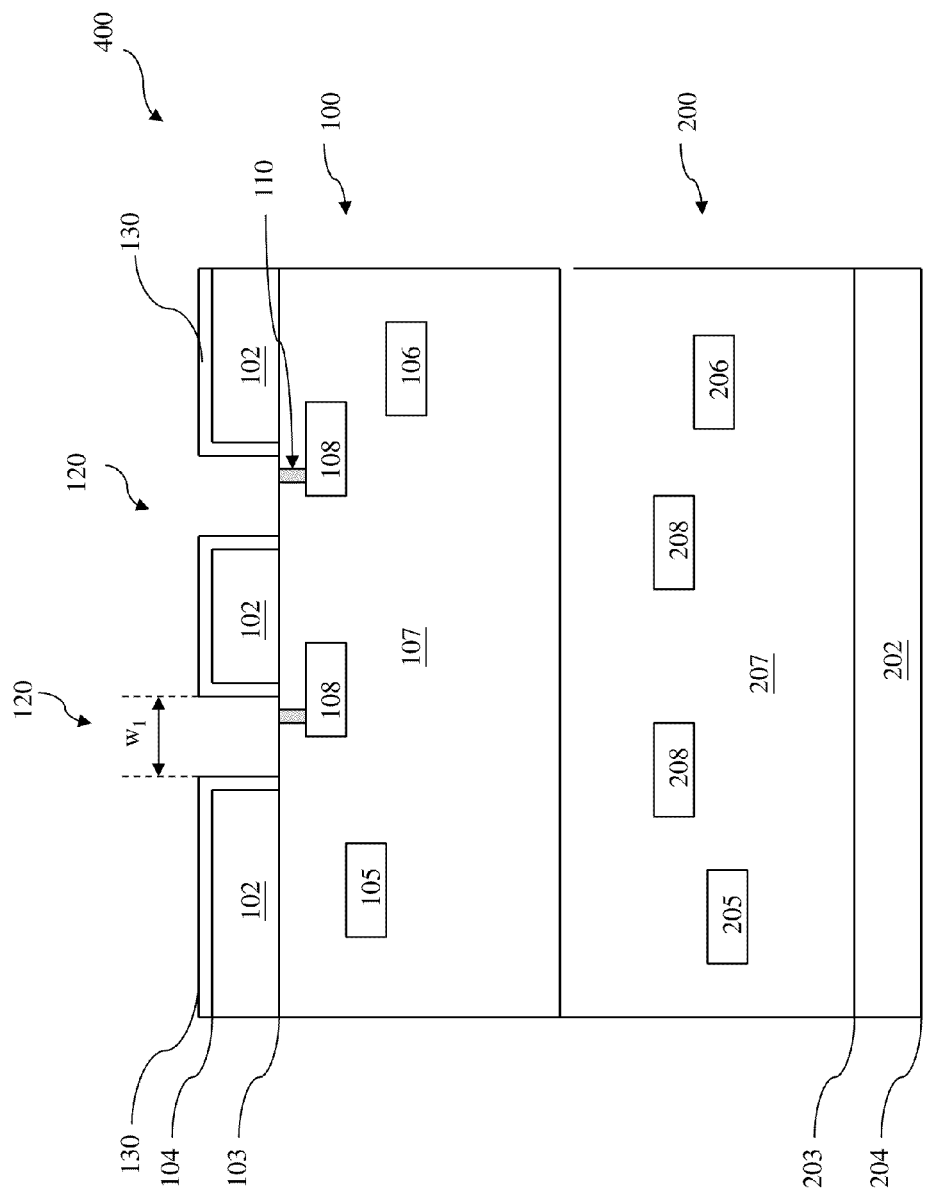

Referring to FIGS. 2 and 5, the method 300 proceeds to step 306 by forming an isolation layer 130 over the second surface 104 of the substrate 102 including sidewalls of the substrate trench 120. The isolation layer 130 provides an electric isolation sealing to the substrate 102. The isolation layer 130 may include dielectric materials such as silicon oxide, silicon nitride, silicon oxynitride, polyimide, or other suitable materials. The isolation layer 130 can be formed by CVD, PVD, ALD, and/or other suitable deposition processes. In one embodiment, another lithography and etch processes are performed to remove the isolation layer 130 at the bottom of the substrate trench 120. With the isolation layer 130 on the sidewalls, the substrate trench 120 has a first width $w_1$.

Figure 6:
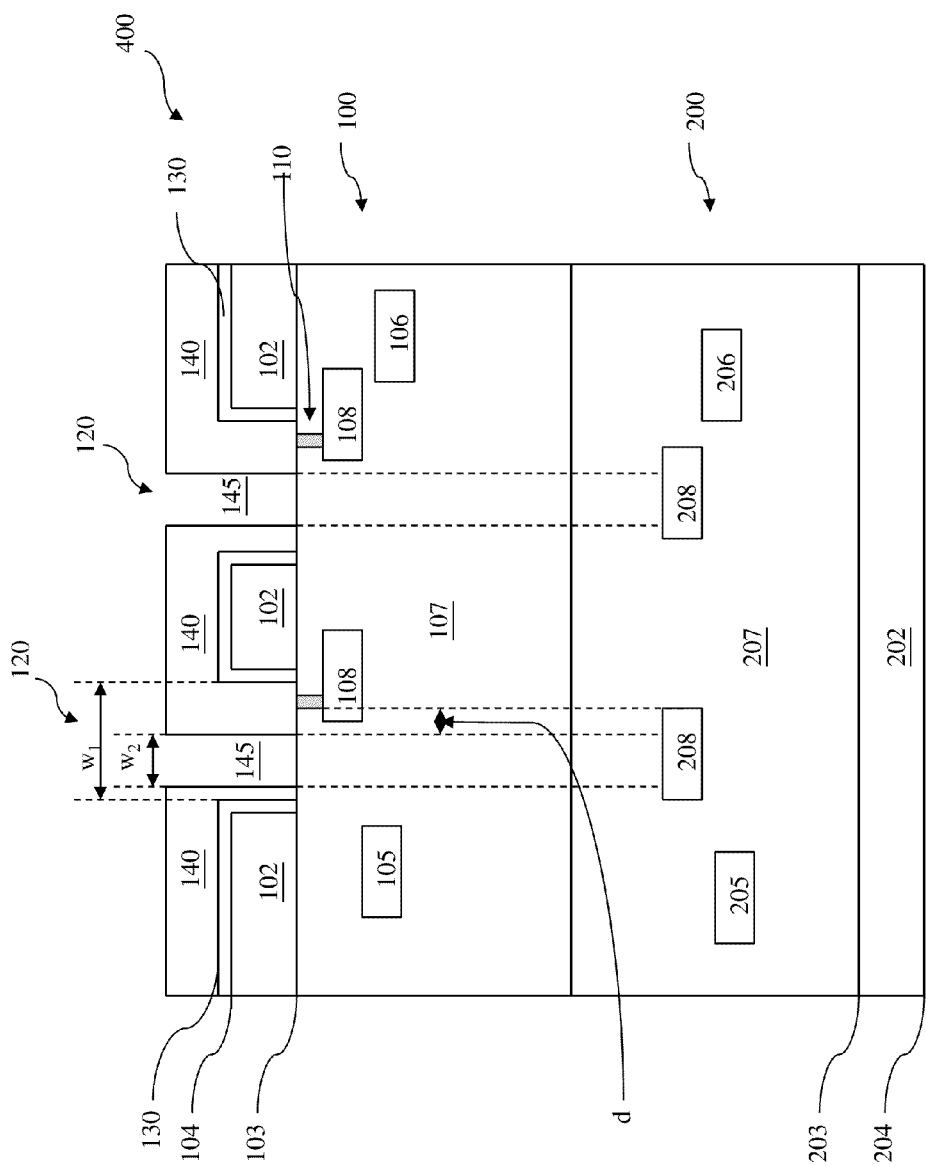

Referring to FIGS. 2 and 6, the method 300 proceeds to step 308 by forming a patterned mask 140 having deep-interconnect-trench (DIT) openings 145 with a second width $w_2$ and aligning to the substrate trench 120. The patterned mask 140 may be a photoresist layer. The patterned mask 140 is formed on top of the second surface 104 using suitable deposition and photo lithography techniques. In present embodiment, the DIT openings 145 align with the corresponding second interconnection feature 208 located in the second semiconductor wafer 200 and having a distance d away from the conductive plug 109 in the first ILD layer 107.

Figure 7:
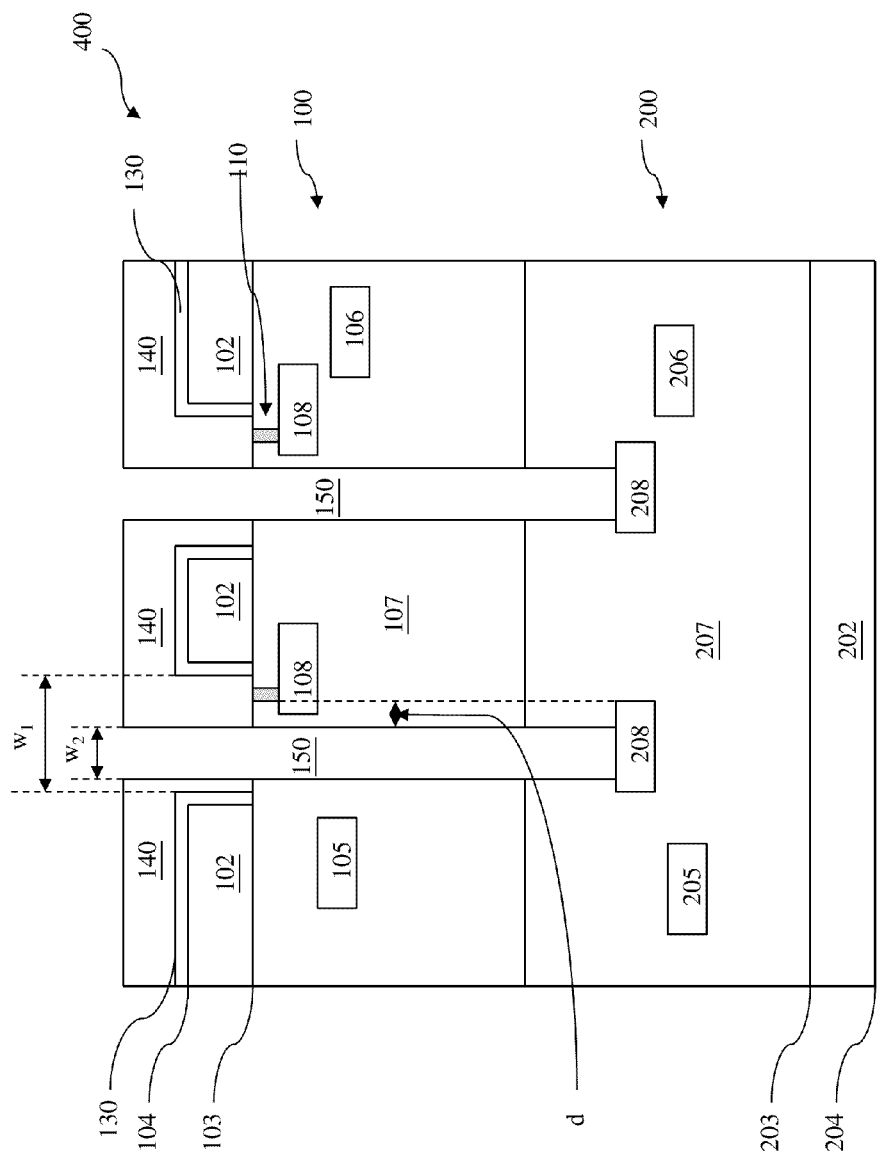

Referring to FIGS. 2 and 7, the method 300 proceeds to step 310 by forming first DITs 150 from the first semiconductor wafer 100 to the second interconnection feature 208 in the second semiconductor wafer 200. The first DITs 150 may be formed by etching the first ILD layer 107 in the first semiconductor wafer 100 and the second ILD layer 207 in the second semiconductor wafer 200 through the DIT openings 145. The DITs 150 are formed with a width which is substantially similar to the second width $w_2$ of the DIT openings 145. A suitable etching process includes a dry etch, an anisotropic wet etch, or any other suitable anisotropic etch.

Figure 8:
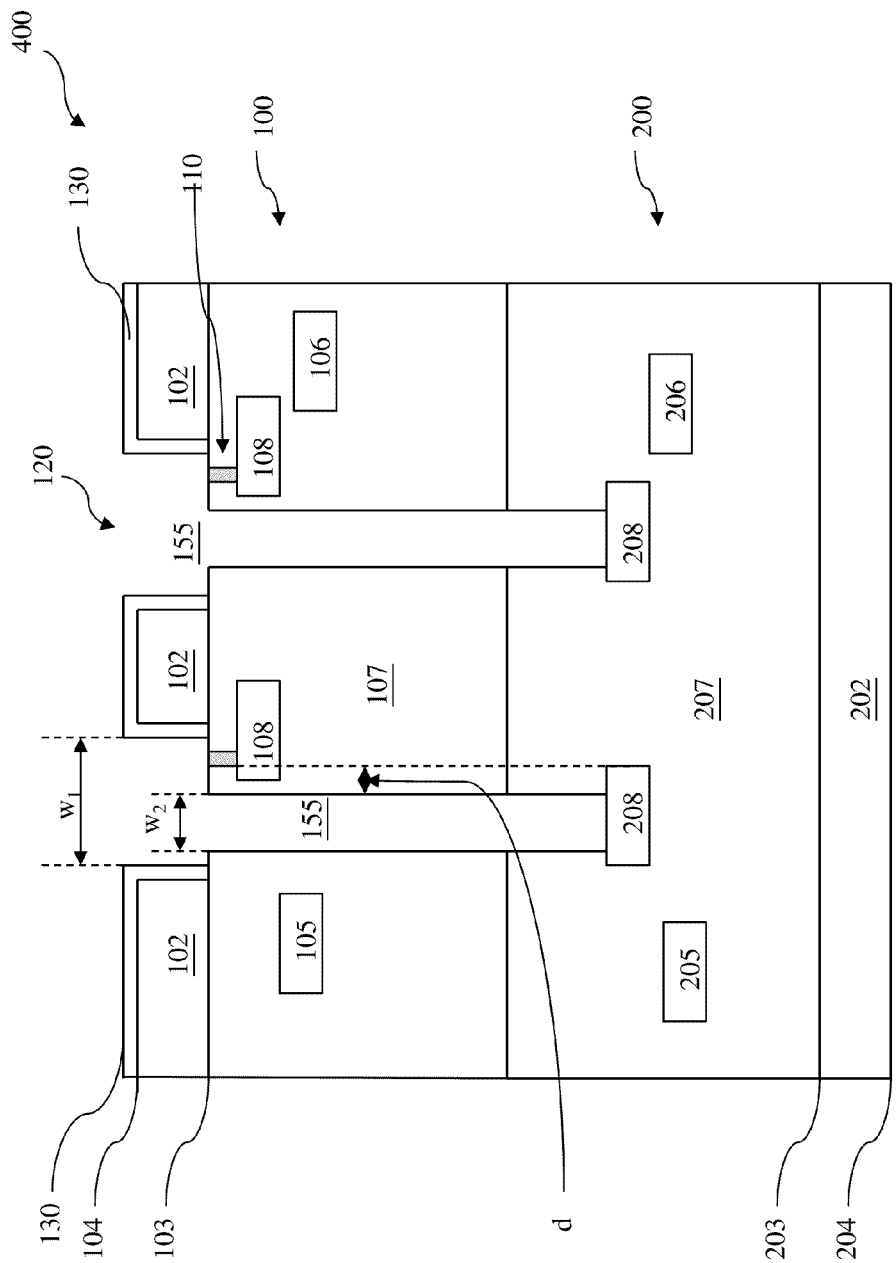

Referring to FIGS. 2 and 8, the method 300 proceeds to step 312 by removing the patterned mask 140 to form second DITs 155. As an example, the patterned photoresist mask 140 is removed by a process such as wet stripping or $O_2$ plasma ashing. In one embodiment, the second DITs 155 is formed to have the substrate trench 120 as an upper portion with the first width $w_1$ and the first DIT 150 as a lower portion with the second width $w_2$. Also, the conductive plug 110 is exposed in the upper portion of the second DITs 155.

Figure 9:
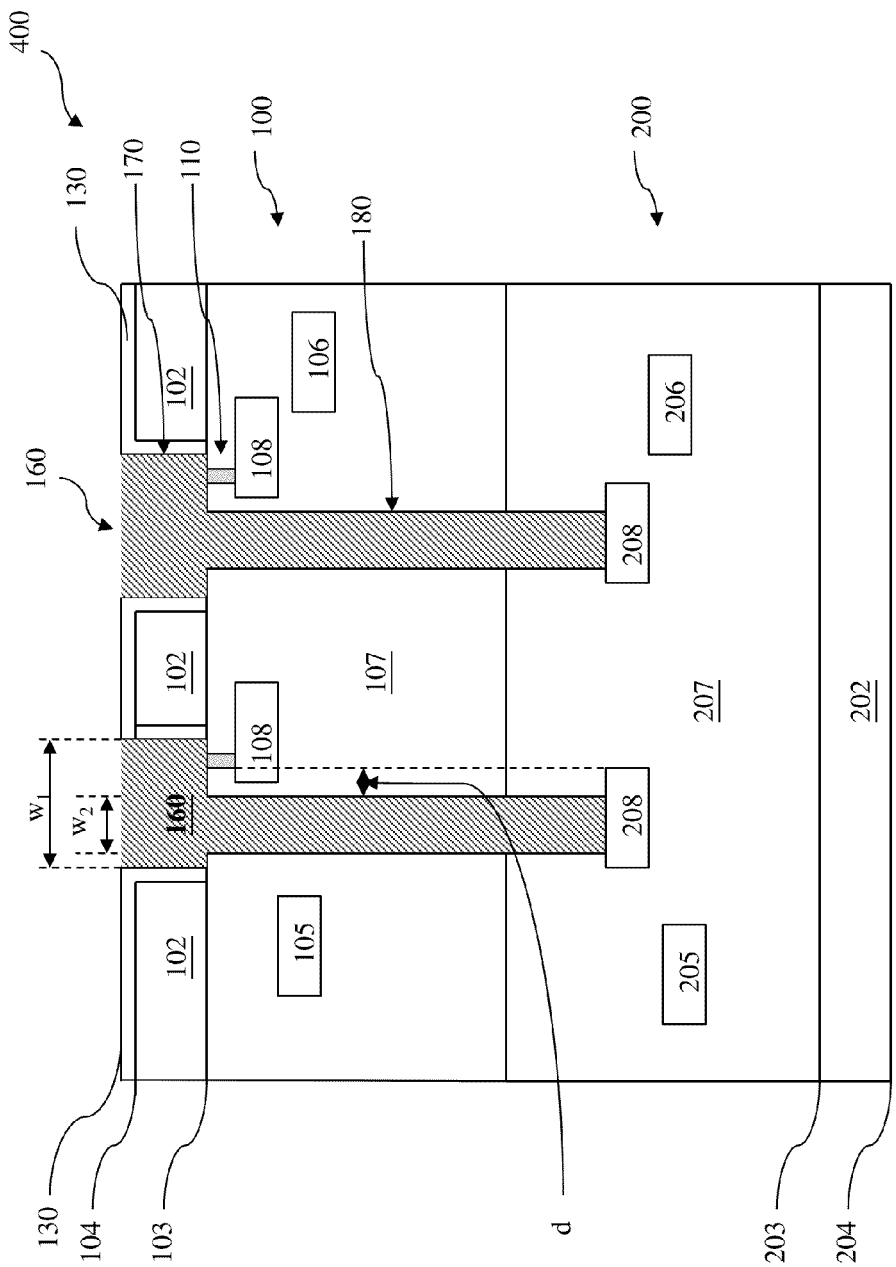

Referring to FIGS. 2 and 9, the method 300 proceeds to step 314 by filling in the second DITs 155 with conductive materials to form deep-interconnect-plugs (DIPs) 160. The DIPs 160 include highly-conductive, low-resistive metal, elemental metal, transition metal, or the like. For example, the DIPs 160 include copper, copper alloy, such as copper magnesium (CuMn), copper aluminum (CuAl) or copper silicon (CuSi), although other materials, such as tungsten, aluminum could alternatively be utilized. The DIPs 160 may be formed by any suitable method known in the art such as PVD, sputter, CVD, electroplating and/or the like. In one embodiment, the DIP 160s are further surrounded by a barrier layer to prevent diffusion and/or provide material adhesion. The barrier layer may include titanium nitride (TiN), tantalum nitride (TaN), tungsten nitride (WN), titanium silicon nitride (TiSiN) or tantalum silicon nitride (TaSiN). The DIPs 160 is formed with an upper portion having the first width $w_1$ and a lower portion having the second width $w_2$. Additionally, a chemical mechanical polishing (CMP) may be applied to remove the conductive material for planarization effect if a desired topography is needed.

In the present embodiment, the upper portion of the DIP 160 connects with the substrate plug 110 (the first semiconductor wafer 100) and the low portion of the DIP 160 (the second semiconductor wafer 200) separately, the upper portion of the DIP 160 is referred to as a common conductive feature 170 for the first and second semiconductor wafers. The common conductive feature 170 has the first width $w_1$. The lower portion of the DIP 160 is referred to as a conductive deep-plug 180 and has the second width $w_2$. The $w_1$ is substantially larger than $w_2$. The conductive deep-plug 180 is separated to the substrate plug 110 with the distance d in the first ILD layer 107.

It should be noted that while FIG. 9 illustrates two semiconductor wafers stacked together, one skilled in the art will recognize that the stacked IC device shown in FIG. 9 is merely an example. There may be many alternatives, variations and modifications. For example, the stacked IC device may accommodate more than two wafers.

Based on the above, the present disclosure offers a stacked IC device employing an interconnection structure to provide electronic connection among two semiconductor wafers and fabrication. The interconnection structure is configured that both first and second semiconductor wafer connect individually to a common conductive feature in the first wafer. The first semiconductor wafer connects to the common conductive feature by a conductive plug formed in the first semiconductor wafer while the second semiconductor wafer connects to the common conductive feature by another conductive plug traveling through both of the first and a portion of second semiconductor wafers. The interconnection structure may provide electric interconnections between two semiconductor wafers with a shorter connection length, a denser interconnection feature layout and a reduced aspect ratio of the conductive plug.

The present disclosure provides many different embodiments of a stacked IC device. The stacked IC device includes a first wafer and a second wafer bonded on the first wafer. The first wafer includes a first substrate, a common conductive feature in the first substrate, a plurality of first interconnect components formed in first inter-level dielectric (ILD) layers over the first substrate, a first interconnection feature in first ILD layers and a conductive plug connecting the first interconnection feature to the common conductive feature. The second wafer includes a second substrate, a plurality of second interconnect components formed in second ILD layers over the second substrate and a second interconnection feature in second ILD layers. The device also includes a conductive deep plug connecting to the common conductive feature in the first wafer and the second interconnection feature in the second wafer. The conductive deep plug is separated with the conductive plug by the first ILD layer.

In another embodiment, a stacked IC device includes a first semiconductor wafer. The first semiconductor wafer includes a first interconnection feature and a conductive plug connecting to the first interconnection feature. The stacked IC device also includes a second semiconductor wafer bonded on the first semiconductor wafer. The second semiconductor wafer includes a second interconnection feature. The stacked IC device also includes a conductive deep plug coupled between the first and second interconnection feature. The conductive deep plug includes an upper portion connecting to the conductive plug in the first semiconductor wafer and a lower portion connective to the second interconnection feature in the second semiconductor wafer.

In yet another embodiment, a method for fabricating a stacked IC device includes providing a first semiconductor wafer. The first semiconductor wafer includes a first substrate, a first inter-level dielectric (ILD) layer over the first substrate, a first interconnection feature in the first ILD layer and a conducive plug in the first ILD layer. The conductive plug connects with the first substrate and the first interconnection feature. The method also includes bonding the first semiconductor wafer on a second semiconductor wafer. The second semiconductor wafer includes a second substrate, a second inter-level dielectric (ILD) layer over the second substrate and a second interconnection feature in the second ILD layers. The method also includes forming a substrate trench in the first substrate to expose the conductive plug and the first ILD layer, depositing a dielectric isolation layer over the first substrate and sidewalls of the substrate trench, then removing the dielectric isolation layer from a bottom of the substrate trench to expose the first ILD layer, forming a deep-interconnection-trench (DIT) pattern mask in the substrate trench, etching the first ILD and a portion of the second ILD through the DIT pattern mask to form a first DIT connecting to the second interconnection feature, removing the patterned mask to form a second DIT and filling the second DIT with conductive materials to form a conductive deep plug to couple the first and second semiconductor wafers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first semiconductor element that includes:
        a first semiconductor substrate;
        a common conductive feature disposed in the first semiconductor substrate, the common conductive feature formed of a first conductive material, the common conductive feature having a bottom surface facing a second semiconductor substrate;
        a first dielectric layer disposed over the first semiconductor substrate;
        a first interconnection feature formed in the first dielectric layer over the first semiconductor substrate; and
        a conductive plug disposed within the first dielectric layer and connecting the first interconnection feature to the common conductive feature, the conductive plug formed of a second conductive material that is different than the first conductive material;
    a second semiconductor element bonded to the first semiconductor element, wherein the second semiconductor element includes:
        the second semiconductor substrate;
        a second dielectric layer disposed over the second semiconductor substrate; and
        a second interconnection feature formed in the second dielectric layer over the second semiconductor substrate; and
    a conductive deep plug physically contacting the common conductive feature and extending continuously through the first dielectric layer and into a portion of the second dielectric layer such that the conductive deep plug physically contacts the second interconnection feature in the second semiconductor element, wherein the conductive plug has a sidewall facing a sidewall of the conductive deep plug, wherein the sidewall of the conductive plug and the sidewall of the conductive deep plug physically contact the bottom surface of the common conductive feature, wherein the first dielectric layer extends continuously from the sidewall of the conductive plug to the sidewall of the conductive deep plug, and
    wherein the bottom surface of the common conductive is disposed directly over the first interconnection feature, the second interconnection feature, the conductive plug, and the conductive deep plug such that the bottom surface of the common conductive overlaps the first interconnection feature, the second interconnection feature, the conductive plug, and the conductive deep plug.

2. The device of claim 1, wherein the conductive deep plug is coupled with the first interconnection feature through the common conductive feature.

3. The device of claim 1, wherein a width of the common conductive feature is substantially larger than a width of the conductive deep plug.

4. The device of claim 1, wherein the conductive plug and the conductive deep plug connect the common conductive feature individually and directly.

5. The device of claim 1, wherein the first semiconductor element includes an image sensor.

6. The device of claim 1, wherein the second semiconductor element includes an application-specific integrated circuit (ASIC).

7. A stacked integrated circuit device comprising:
    a first semiconductor element including:
        a first inter-level dielectric layer disposed over a first semiconductor substrate;
        a first interconnection feature embedded within the first inter-level dielectric layer; and
        a conductive plug embedded within the first inter-level dielectric layer and coupled to the first interconnection feature;
    a second semiconductor element bonded on the first semiconductor element, wherein second semiconductor element includes:
        a second inter-level dielectric layer disposed over a second semiconductor substrate;
        a second interconnection feature embedded within the second inter-level dielectric layer; and
    a conductive deep plug extending continuously through the first semiconductor substrate, the first inter-level dielectric layer and into a portion of the second inter-level dielectric layer to couple the first and second interconnection features, wherein the conductive deep plug includes:
        an upper portion connecting to the conductive plug in the first semiconductor element, wherein the upper portion has a surface facing the second semiconductor substrate, wherein the conductive plug has a sidewall facing a sidewall of the upper portion of the conductive deep plug, wherein the sidewall of the conductive plug and physically contact the surface of the upper portion, wherein the first inter-level dielectric layer extends continuously from the sidewall of the conductive plug to the sidewall of the upper portion of the conductive deep plug, wherein the upper portion of the conductive deep plug and the conductive plug are formed of different conductive materials; and
        a lower portion connective to the second interconnection feature in the second semiconductor element, wherein the surface of the upper portion is disposed directly over the first interconnection feature, the second interconnection feature, and the conductive plug such that the surface of the upper portion overlaps the first interconnection feature, the second interconnection feature, and the conductive plug.

8. The device of claim 7, wherein a width of the upper portion of the conductive deep-plug is substantially larger than a width of the lower portion.

9. The device of claim 7, wherein the lower portion of the conductive deep plug is formed through the first inter-level dielectric layer and a portion of the second inter-level dielectric layer.

10. The device of claim 7, wherein the first semiconductor element includes an image sensor.

11. The device of claim 7, wherein the second semiconductor element includes an application-specific integrated circuit (ASIC).

12. The device of claim 7, wherein the upper portion of the conductive deep plug is formed in at least the first inter-level dielectric layer.

13. The device of claim 7, wherein the upper portion of the conductive deep plug includes a first component embedded within the first semiconductor substrate directly over the conductive plug such that the first component physically contacts the conductive plug.

14. The device of claim 13, wherein the first component is disposed within a trench lined by an isolation layer extending through the first semiconductor substrate,
wherein the trench extends through first inter-level dielectric layer without being lined by the isolation layer, and
wherein the upper portion includes a second component disposed within the trench, the second component of the upper portion having the sidewall surface.

15. A device comprising:
a first semiconductor element that includes:
    a first semiconductor substrate;
    a common conductive feature disposed in the first semiconductor substrate, the common conductive feature formed of a first conductive material, the common conductive feature having a bottom surface facing a second semiconductor substrate;
    a first inter-level dielectric layer disposed directly on the first semiconductor substrate;
    a first interconnection feature embedded in the first inter-level dielectric layer; and
    a conductive plug embedded within the first inter-level dielectric layer and physically contacting the common conductive feature, the conductive plug formed of a second conductive material that is different than the first conductive material;
a second semiconductor element bonded to the first semiconductor element, wherein the second semiconductor element includes:
    the second semiconductor substrate;
    a second inter-level dielectric layer disposed directly on the second semiconductor substrate;
    a second interconnection feature embedded in the second inter-level dielectric layer; and
a conductive deep plug physically contacting the common conductive feature, the conductive deep plug extending continuously through the first dielectric layer and into a portion of the second dielectric layer such that the conductive deep plug physically contacts the second interconnection feature in the second semiconductor element, wherein the conductive plug has a sidewall facing a sidewall of the conductive deep plug, wherein the sidewall of the conductive plug and the sidewall of the conductive deep plug physically contact the bottom surface of the common conductive feature, wherein the first dielectric layer extends continuously from the sidewall of the conductive plug to the sidewall of the conductive deep plug, and
wherein the bottom surface of the common conductive is disposed directly over the first interconnection feature, the second interconnection feature, the conductive plug, and the conductive deep plug such that the bottom surface of the common conductive overlaps the first interconnection feature, the second interconnection feature, the conductive plug, and the conductive deep plug.

16. The device of claim 15, wherein the first semiconductor element further includes an isolation layer separating the common conductive feature from the first semiconductor substrate.

17. The device of claim 16, wherein the conductive deep plug is merged with the common conductive element into one continuous conductive element extending through the first semiconductor substrate, the first inter-level dielectric layer, and the portion of the second inter-level dielectric layer.

18. The device of claim 15, wherein the common conductive element and the conductive deep plug are formed of the same material.

19. The device of claim 15, wherein the conductive plug has another sidewall opposing the sidewall of the conductive plug such that the conductive plug has a first thickness measured between the sidewall and the another sidewall of the conductive plug,
wherein the conductive deep plug has another sidewall opposing the sidewall of the conductive deep plug such that the conductive deep plug has a second thickness measured between the sidewall and the another sidewall of the conductive deep plug, and
wherein the common conductive feature has opposing sidewalls such that the common conductive feature has a third thickness measured between the opposing sidewalls of the common conductive feature, and
wherein the first, second, and third thicknesses are different from each other.

20. The device of claim 19, wherein the second thickness is greater than the first and the third thickness is greater than the second thickness.

* * * * *